(12) United States Patent
Chew

(10) Patent No.: US 11,815,079 B2
(45) Date of Patent: Nov. 14, 2023

(54) VACUUM PUMPING SYSTEM HAVING MULTIPLE PUMPS

(71) Applicant: Edwards Limited, Burgess Hill (GB)

(72) Inventor: Andrew David Chew, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 65 days.

(21) Appl. No.: 17/611,793

(22) PCT Filed: Apr. 24, 2020

(86) PCT No.: PCT/GB2020/051014
§ 371 (c)(1),
(2) Date: Nov. 16, 2021

(87) PCT Pub. No.: WO2020/240152
PCT Pub. Date: Dec. 3, 2020

(65) Prior Publication Data
US 2022/0316462 A1 Oct. 6, 2022

(30) Foreign Application Priority Data

May 24, 2019 (GB) .................................... 1907350

(51) Int. Cl.
F04B 37/02 (2006.01)
F04B 37/14 (2006.01)
(Continued)

(52) U.S. Cl.
CPC .............. F04B 7/02 (2013.01); C23C 14/564 (2013.01); F04B 37/08 (2013.01); F04B 37/14 (2013.01);
(Continued)

(58) Field of Classification Search
CPC .......... F04B 37/02; F04B 37/08; F04B 37/14; F04B 41/06; F04B 49/06; H01J 7/18; H01J 41/16; C23C 14/564; Y10S 417/901
See application file for complete search history.

(56) References Cited

U.S. PATENT DOCUMENTS 3,391,303 A * 7/1968 Hall .................... H01J 41/20
313/355
6,165,328 A * 12/2000 Lorimer ................. F04B 37/02
204/192.12
(Continued)

FOREIGN PATENT DOCUMENTS

CN 205858605 U 1/2017
CN 108119329 A 6/2018
(Continued)

OTHER PUBLICATIONS

British Examination Report dated Nov. 8, 2019 and Search Report dated Nov. 7, 2019 for corresponding British Application No. GB1907350.1, 5 pages.
(Continued)

Primary Examiner — Peter J Bertheaud
(74) Attorney, Agent, or Firm — Theodore M. Magee; Westman, Champlin & Koehler, P.A.

(57) ABSTRACT

A vacuum pumping system comprising: a high pressure getter pump configured to operate from an initial pressure of between 10 and $10^{-2}$ mbar to a second pressure between $10^{-3}$ mbar and $10^{-6}$ mbar and at least one high vacuum pump configured to operate at higher vacuums than the high pressure getter pump, the two pumps being mounted on a same flange, the flange being configured to mount the vacuum pumping system to a vacuum chamber.

15 Claims, 3 Drawing Sheets

(51) Int. Cl.
  *F04B 41/06*    (2006.01)
  *F04B 49/06*    (2006.01)
  *F04B 37/08*    (2006.01)
  *H01J 41/16*    (2006.01)
  *H01J 7/18*     (2006.01)
  *C23C 14/56*    (2006.01)
  *F04B 7/02*     (2006.01)

(52) U.S. Cl.
  CPC .............. *F04B 41/06* (2013.01); *F04B 49/06* (2013.01); *H01J 7/18* (2013.01); *H01J 41/16* (2013.01); *Y10S 417/901* (2013.01)

(56) References Cited

U.S. PATENT DOCUMENTS

| 2013/0078112 A1 | 3/2013 | McIver |
| 2018/0068836 A1 | 3/2018 | Wynohrad et al. |

FOREIGN PATENT DOCUMENTS

| DE | 4110588 A1 | 10/1992 |
| GB | 2164788 A | 3/1986 |
| GB | 2578138 A | 4/2020 |
| GB | 2578293 A | 5/2020 |
| RU | 2661493 C1 | 7/2018 |
| WO | 9735652 A1 | 10/1997 |
| WO | 2009118398 A1 | 10/2009 |
| WO | 2010105944 A1 | 9/2010 |

OTHER PUBLICATIONS

International Search Report and Written Opinion dated Jun. 30, 2020 for corresponding PCT application Serial No. PCT/GB2020/051014, 12 pages.

Agilent Technologies, Agilent 4UHV Ion Pump Controller Design to Optimize Pump Performance—Vacuum Solutions, www.agilent.com/chem, 8 pages, 2017.

SAES Getters Group, SAES CapaciTorr Pumps MB5 Series, www.saesgetters.com, 9 pages, 2001.

SAES Group, SAES NEXTorr D100-5 MB9 Series, 12 pages, 2013.

Vaclon Plus 55, Instruction Manual, 30 pages, 1997.

\* cited by examiner

VACUUM PUMPING SYSTEM HAVING MULTIPLE PUMPS

CROSS-REFERENCE OF RELATED APPLICATION

This application is a Section 371 National Stage Application of International Application No. PCT/GB2020/051014, filed Apr. 24, 2020, and published as WO 2020/240152 A1 on Dec. 3, 2020, the content of which is hereby incorporated by reference in its entirety and which claims priority of British Application No. 1907350.1, filed May 24, 2019.

FIELD

The field of the invention relates to a vacuum pumping system.

BACKGROUND

There are a range of vacuum pumps available with different types of pumps providing different levels of vacuum and being suitable for different pressure regions and operating conditions.

Such pumps include primary pumps such as Roots, Scroll and Northey-claw pumps which are operable from atmospheric pressure to ~$1\times10^{-2}$ mbar. To reach pressures below $10^{-2}$ mbar a different type of vacuum pump is required and this has generally been provided by a turbomolecular pump. Turbomolecular pumps are able to evacuate from about $10^{-1}$ mbar to $<10^{-11}$ mbar depending on their design and configuration. Although turbomolecular pumps are designed to operate in these pressure regions they require a backing pump as they cannot exhaust to atmosphere. Furthermore, owing to their high speed of rotation and close manufacturing tolerances, they are vulnerable to mechanical shocks. For higher vacuums getter pumps are often used. These pumps are a capture pump and have a limited lifetime. They operate at high vacuums and operation at lower vacuums reduces their lifetime considerably.

There are advantages and drawbacks with the different pump types, that have been developed for the different pressure regions and operating conditions.

In order to provide an effective pumping system it may be appropriate to use a combination of pumps. A potential drawback is in the size and effectiveness of such a combination. It would be desirable to be able to provide a pumping system that is able to provide the required level of vacuum in a convenient and compact manner.

The discussion above is merely provided for general background information and is not intended to be used as an aid in determining the scope of the claimed subject matter. The claimed subject matter is not limited to implementations that solve any or all disadvantages noted in the background.

SUMMARY

A first aspect provides a high pressure getter pump configured to operate from an initial pressure of between 10 and $10^{-2}$ mbar down to a second pressure between $10^{-3}$ mbar and $10^{-6}$ mbar and at least one high vacuum pump configured to operate at higher vacuums than said high pressure getter pump, said two pumps being mounted on a same flange, said flange being configured to mount said vacuum pumping system to a vacuum chamber.

When selecting pumps to operate together to provide effective pumping, the inventor of the present invention recognised that the recently developed high pressure getter pumps, some of which may operate in the pressure region of between 10 mbar to $1\times10^{-6}$ mbar, would operate effectively with higher vacuum pumps such as ion pumps to provide a high or ultra-high vacuum without the need for a backing pump. Furthermore, he recognised that were such pumps to be mounted on a single flange this would allow them to form a compact arrangement and to operate in conjunction with each other and avoid, or at least reduce, the need for connecting conduits which affect gas conductance.

Examples of High Pressure Getter pumps able to pump in these higher pressure regions are described in Russian patent application 2017126531 and US 2018/0068836 for example.

In some embodiments, said initial pressure is between 5 and 10 mbar.

In some embodiments, said high pressure getter pump comprises an evaporable getter pump that is powered with a pulsed Voltage.

The use of pulsed voltages allows the evaporable getter to operate effectively at higher pressures, the length of the pulses being controlled to control the amount of evaporation of the getter material. Thus, where pressures are high and depletion may be a problem, shorter pulses are used to conserve the getter material. This allows effective operation at high pressures while maintaining a reasonable lifetime of the pump.

The one or more high vacuum pump may be formed in a number of different ways but in some embodiments, it comprises an ion getter pump, while in others it comprises an evaporable getter pump and in others a non-evaporable getter pump, while in still others a sublimation pump.

Each of the above pumps operate at the vacuums that the high pressure getter pump is able to achieve and none are mechanical pumps. They are each subject to depletion as they capture molecules and thus, they are particularly suitable for use with the high pressure getter pump which is able to achieve significant vacuum levels from a relatively high pressure starting point without the need of a backing pump. In this way a combination of non-mechanical pumps is provided that is able to maintain a high vacuum, generate low vibrations and be resistant to mechanical shocks.

In some embodiments, said high pressure getter pump and said sublimation pump are mounted on a same side of said flange.

Where the high vacuum pump is a sublimation pump it may be advantageous to mount it on the same side of the flange as the high pressure getter pump such that the two pumps are in parallel and can be controlled in such a way that that each activates their capture getter material at different vacuum levels according to their control system. A common surface may be used for the deposit of the capture materials. In this way a particularly compact pump is provided.

Although the sublimation pump may have a number of forms in some embodiments, said sublimation pump comprises a titanium sublimation filament configured on heating to cause said titanium to sublimate and deposit an active layer of titanium on surrounding surface walls. Alternatively it may comprise a tantalum sublimation pump.

In some embodiments, said high pressure getter pump is mounted on one side of said flange and at least one of said at least one high vacuum pump is mounted on the other side of the flange, such that said pumps are arranged in series, with an outlet from said high pressure getter pump connecting via an aperture within the flange to an inlet of said at least one high vacuum pump.

Although it may be advantageous to mount the sublimation pump on the same side of the flange as the high pressure getter pump in some embodiments it may be mounted on the other side of the flange. Furthermore, where there is a further or an alternative high vacuum pump then it may be advantageous to mount it on the opposite side of the flange to the high pressure getter pump. In general it is mounted downstream of the high pressure getter pump. Mounting the two pumps on either side of the flange allows the pumps to operate without unduly impeding the conductance of the other pump and allows them both to be securely mounted to the chamber in a cost effective and convenient manner In some embodiments, the vacuum pumping system further comprises a power supply for providing a high Voltage to said pumps, a same power supply being arranged to supply power to said high presser getter pump and said at least one high vacuum pump.

A further advantage of this combination of pumps is that they operate at similar voltage levels and thus, a single power supply can be used to power them both.

In some embodiments, the vacuum pumping system further comprises a controller for controlling operation of said pumps.

As for the power supply the pumps may be controlled by a single controller allowing the operation of each to be controlled according to the current pressure in the system.

In some embodiments, said controller is configured to control operation of said high pressure getter pump by transmitting pulses of power to said high pressure getter pump to activate said pump and when a pressure has dropped to a predetermined value to transmit pulses of power to said sublimation pump.

Where two of the pumps are the high pressure getter pump and the sublimation pump, the controller may send pulses of power to the high pressure getter pump, the pulse length varying with the pressure in the vacuum chamber, shorter pulses being used at higher pressures, and then when the pressure falls below a certain value the sublimation pump may be initialised with a pulse of heating power to release the capture material of that pump.

In some embodiments, the vacuum pumping system further comprises a primary pump configured to evacuate said chamber to an initial pressure below 10 mbar prior to activation of said high pressure getter pump.

The high pressure getter pump is not operable from atmosphere so initial evacuation of the vacuum chamber may be required. However once evacuated the high pressure getter pump does not need a backing pump and can operate without the need for a mechanical pump to be operational.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Before discussing the embodiments in any more detail, an initial overview will be provided.

Ion getter or sputter pumps are capture pumping mechanisms where titanium or tantalum is deposited to form an active continuously regenerated getter pumping surface. Their maximum starting pressures are sometimes stated to be 0.01 mbar, however in practise a maximum of $1 \times 10^{-4}$ mbar is allowed for starting pressures. Continuous operating pressures are usually at $1 \times 10^{-5}$ mbar with a linear degradation in lifetime versus operating pressure as the capture substance gets used up and becomes exhausted.

Other pump combinations are required to prime these IGP to their starting pressure, these pump combinations include a primary pump in combination with a turbomolecular pump. The combination of pumps provided by embodiments require only a rough vacuum to activate them and thereafter can operate without a backing pump. Such a rough vacuum can be provided by a primary pump such as a diaphragm pump or a scroll pump. Once the pump has been primed continuous getter pumping operation can be provided from 5 to 10 mbars downwards. This is achieved by using a high pressure getter pump such as that disclosed in RU 2017126531 and which uses pulsed discharge of the getter material, the lengths of the pulses being controlled to adapt to the pressure allowing them to operate at higher pressure without becoming unduly exhausted. These high pressure getter pumps can be used in conjunction with other pumps that operate at a higher vacuum to provide ultrahigh vacuum or extremely high vacuum operation. Embodiments mount these combination of pumps on the same flange allowing for a convenient and effective vacuum pumping system that can provide the appropriate high vacuum for a particular vacuum chamber, the flange being adapted to be mounted on the vacuum chamber outlet.

Figure 1:
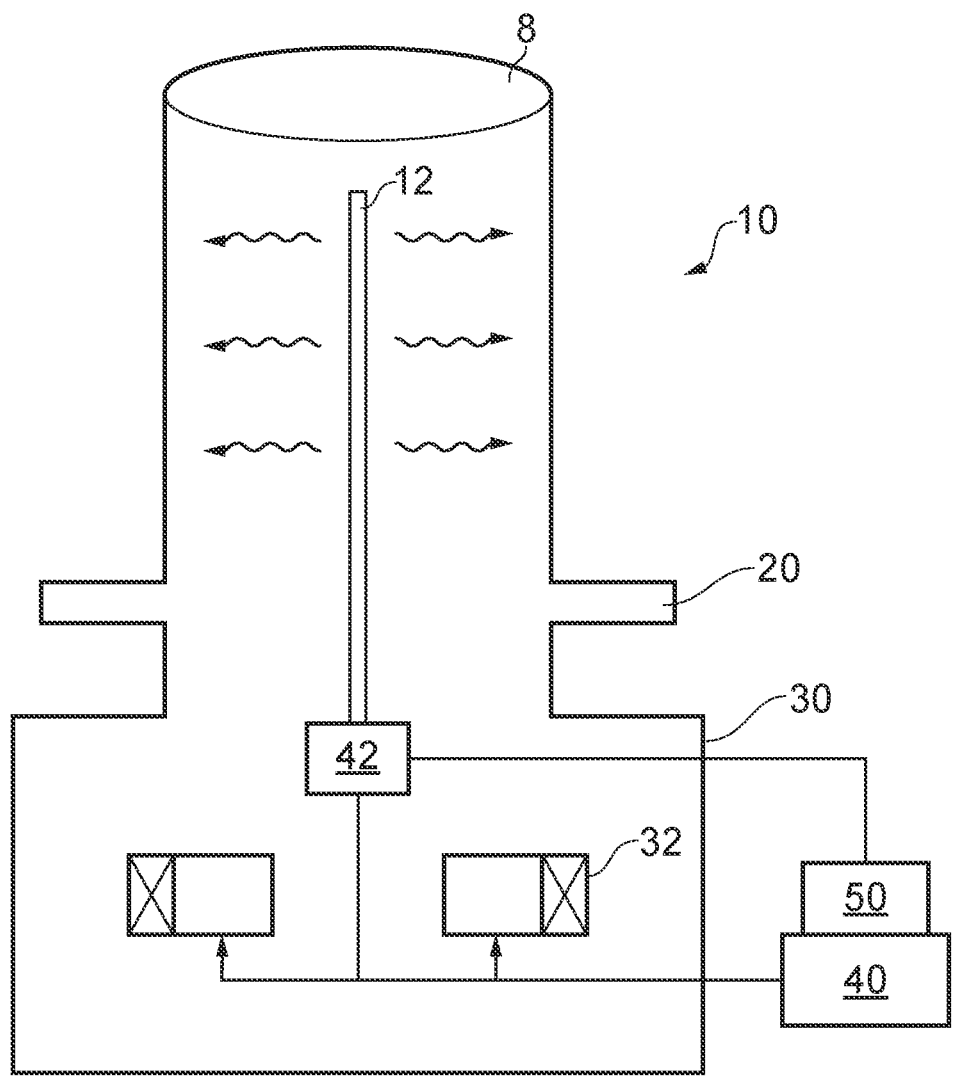
FIG. 1 shows a vacuum pumping system according to an embodiment.

FIG. 1 shows an example of a first embodiment where the high pressure getter pump 10 is mounted on one side of flange 20 with an ion getter pump 30 mounted on the opposite side of the flange.

The high pressure getter pump 10 comprises a source 12, of in this case titanium, which is pulsed with a current in order to activate the titanium and cause it to atomise and coat surfaces of a shield 8 mounted around the source. Control of the pulsing allows the amount of getter substance that is atomised to be controlled and depends on the pressure in the vacuum chamber. This high pressure getter pump 10 can operate from pressures of between 5 and 10 mbar and will evacuate the chamber down to $10^{-5}$ to $10^{-6}$ mbar. The pump 10 is mounted on flange 20 which will be connected to a vacuum chamber, pump 10 extending into the vacuum chamber. In this embodiment there is an ion getter pump 30 mounted on the other side of the flange 20 outside of the chamber and this receives gas from the chamber that has been evacuated by the high pressure getter pump 10 and this acts to further lower the pressure within vacuum chamber. The ion getter pump 30 is a conventional ion getter pump with magnets 32.

The two pumps 10, 30 mounted on flange 20 are powered by a high voltage supply 40. High voltage supply 40 supplies power to the ion getter pump 30 and to the high pressure getter pump 10. The power sent to the high pressure pump 10 is sent via a pulsed rectifier 42. The power supply and pulsed rectifier are controlled by control circuitry 50, which controls the lengths of the pulses in dependence upon the pressure in the vacuum chamber which is measured by a pressure sensor not shown.

Figure 2:
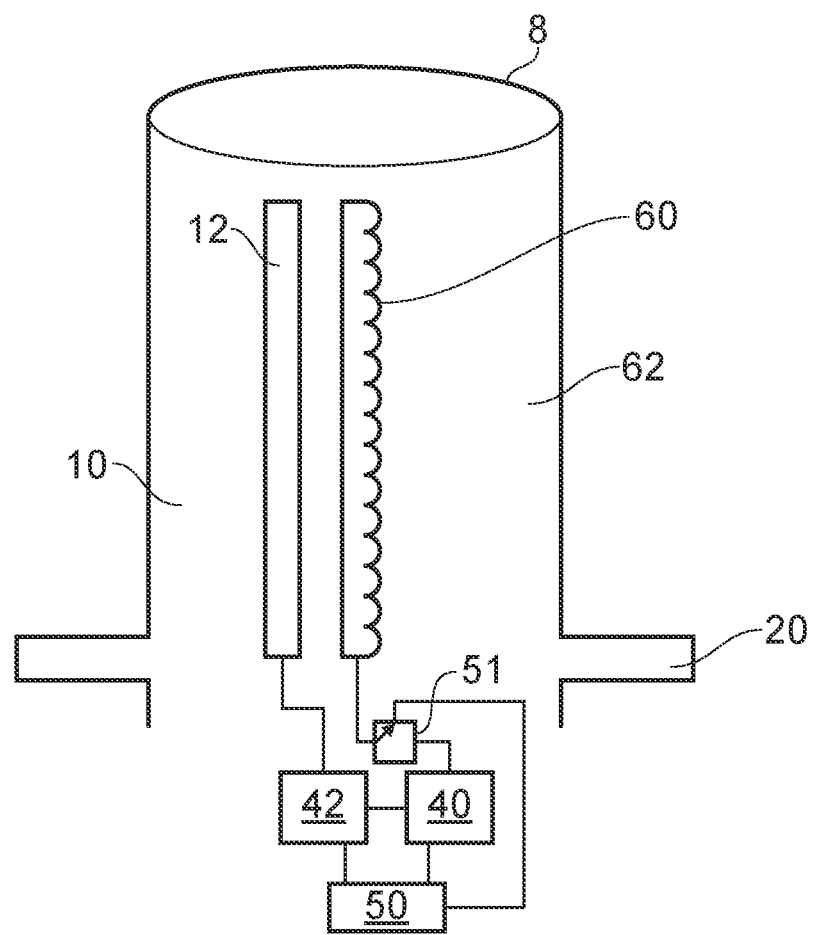
FIG. 2 shows a vacuum pumping system according to a further embodiment.

FIG. 2 shows an alternative embodiment where the high pressure getter pump 10 is mounted on flange 20 alongside a titanium sublimation pump 62. Titanium sublimation pump has a filament 60 to which current is sent from power supply 40 controlled by control circuitry 50. In this embodiment the two sources of capture material of the two pumps 10 and 60 are mounted side by side on the same side of the flange 20 such that they act in parallel. The two sources are at least partially surrounded by shield 8 which acts as surface on which the capture material that is evaporated or sublimed from the two sources condenses. This material then acts as a capture material for molecules within the vacuum chamber.

Initially control circuitry 50 sends power from power supply 40 to the high pressure getter pump 10 via the pulsed rectifier 42 to lower the pressure within vacuum chamber to $10^{-5}$ or $10^{-6}$ mbar. When the pressure has fallen sufficiently the titanium sublimation pump filament is made active and control circuitry 50 will send pulses of energy through switch 51 to this filament such that the titanium sublimes and forms a further capture material on the surface of the shield 8 within the vacuum chamber.

Figure 3:
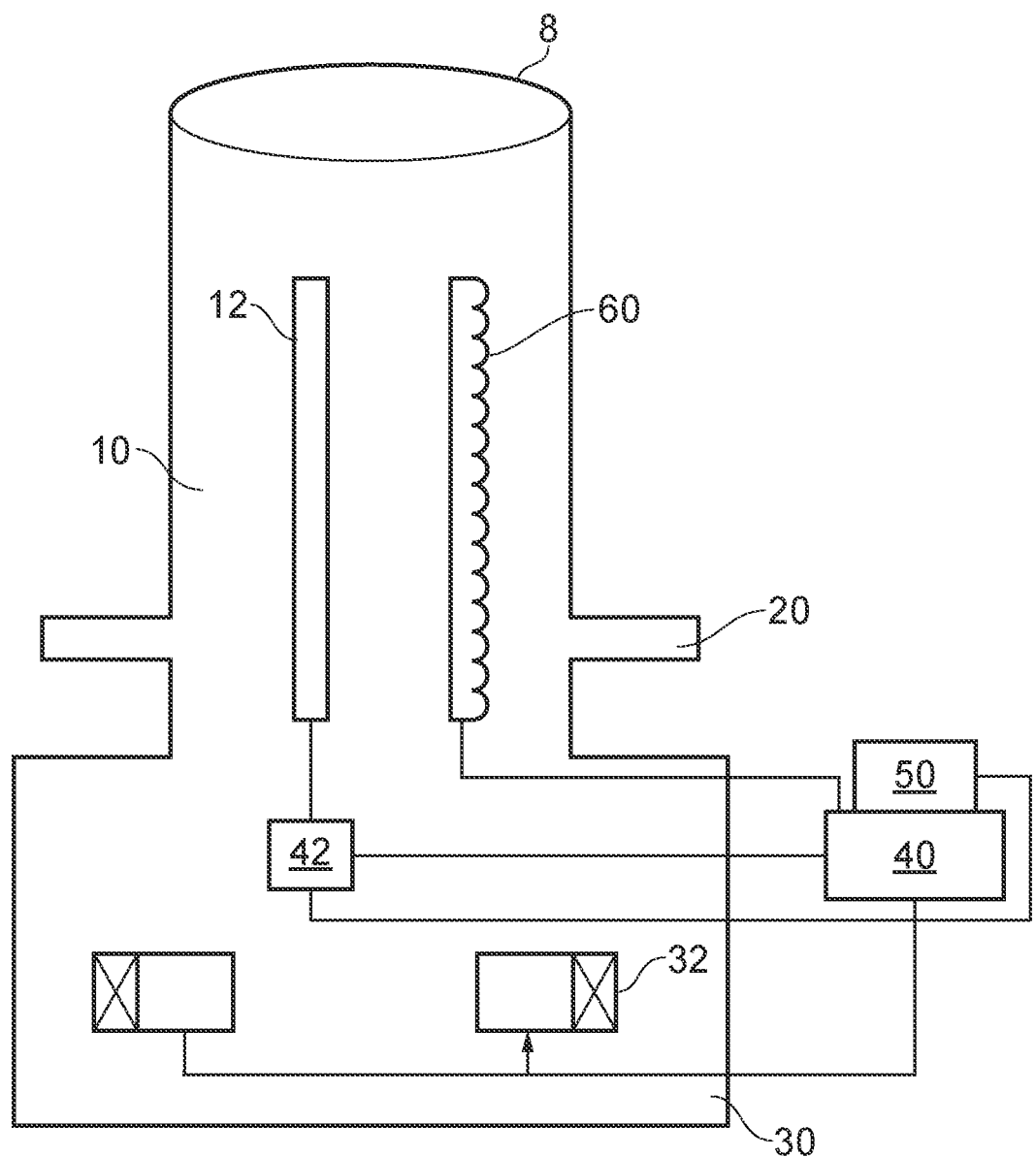
FIG. 3 shows a vacuum pumping system according to a yet further embodiment.

FIG. 3 shows a further embodiment where in addition to the two pumps 10 and 62 there is a further ion getter pump 30 mounted on the opposite side of flange 20 such that three pumps are mounted on a single flange 20 and provide the ultra-high vacuum for the vacuum chamber without the need for a backing pump which is permanently operational as is required if a turbomolecular pump is used in the combination of pumps. In this regard an initial primary pump to get the pressure down to 5 to 10 mbar is required but as the high pressure getter pump can operate at pressures that are significantly higher than the pressures of operation of a more conventional getter pump a turbomolecular pump to provide a higher vacuum is not required. A diaphragm pump or a scroll pump may be used as the primary pump to provide the initial starting vacuum for the high pressure getter pump.

In summary, embodiments provide a single flange getter pump mechanism to operate continuously from the region of 5 to 10 mbar. Once this pressure has been attained the pumps that operate to provide the higher vacuums require no moving parts so that the pump may be portable. Furthermore there are no cooling requirements, a common high voltage power supply such as is used for a standard ion getter pump may be used for the combination of pumps. A pumping capacity of the region of 10 l/s from the high pressure getter pump and 50 l/s from the ion getter pump would be typical pumping speeds for a 6 inch flange size pump.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A vacuum pumping system comprising:
a flange configured to mount to a vacuum chamber wall;
a high pressure getter pump configured to operate from an initial pressure of between 10 and $10^{-2}$ mbar to a second pressure between $10^{-3}$ mbar and $10^{-6}$ mbar, the high pressure getter pump comprising a source and a surface extending around the source wherein the surface extends through the vacuum chamber wall when the flange is mounted to the vacuum chamber wall; and
at least one high vacuum pump configured to operate at higher vacuums than said high pressure getter pump, the high vacuum pump mounted on the flange.

2. The vacuum pumping system according to claim 1, wherein said high pressure getter pump comprises an evaporable getter pump that is powered with a pulsed Voltage.

3. The vacuum pumping system according to claim 1, wherein said at least one high vacuum pump comprises an ion getter pump.

4. The vacuum pumping system according to claim 1, wherein said at least one high vacuum pump comprises an evaporable getter pump.

5. The vacuum pumping system according to claim 1, wherein said at least one high vacuum pump comprises a non-evaporable getter pump.

6. The vacuum pumping system according to claim 1, wherein said at least one high vacuum pump comprises a sublimation pump.

7. The vacuum pumping system according to claim 6, wherein said high pressure getter pump and said sublimation pump are mounted on a same side of said flange.

8. The vacuum pumping system according to claim 7, wherein said sublimation pump comprises a titanium or tantalum sublimation filament configured on heating to cause said titanium to sublimate and deposit an active layer of titanium on the surface extending around the source.

9. The vacuum pumping system according to claim 1, wherein said high pressure getter pump is mounted on one side of said flange and at least one of said at least one high vacuum pump is mounted on the other side of the flange, such that said pumps are arranged in series, with an outlet from said high pressure getter pump connecting via an aperture within the flange to an inlet of said at least one high vacuum pump.

10. The vacuum pumping system according to claim 1, further comprising a power supply for providing a high Voltage to said pumps, a same power supply being arranged to supply power to said high pressure getter pump and said at least one high vacuum pump.

11. The vacuum pumping system according to claim 1, further comprising a controller for controlling operation of said pumps.

12. The vacuum pumping system according to claim 11, wherein said controller is configured to control operation of said high pressure getter pump by transmitting pulses of power to said high pressure getter pump to activate said pump and when a pressure has dropped to a predetermined value to transmit pulses of power to said sublimation pump.

13. The vacuum pumping system according to claim 1, further comprising a primary pump configured to evacuate said chamber to an initial pressure below 10 mbar prior to activation of said high pressure getter pump.

14. A vacuum pumping system comprising:
a high pressure getter pump configured to operate from an initial pressure of between 10 and $10^{-2}$ mbar to a second pressure between $10^{-3}$ mbar and $10^{-6}$ mbar; and
at least one high vacuum pump configured to operate at higher vacuums than said high pressure getter pump, said two pumps being mounted on a same flange, said flange being configured to mount said vacuum pumping system to a vacuum chamber;
wherein said at least one high vacuum pump comprises an ion getter pump.

15. A vacuum pumping system comprising:
a high pressure getter pump configured to operate from an initial pressure of between 10 and $10^{-2}$ mbar to a second pressure between $10^{-3}$ mbar and $10^{-6}$ mbar; and
at least one high vacuum pump configured to operate at higher vacuums than said high pressure getter pump, said two pumps being mounted on a same flange, said flange being configured to mount said vacuum pumping system to a vacuum chamber;
wherein said high pressure getter pump is mounted on one side of said flange and at least one of said at least one high vacuum pump is mounted on the other side of the flange, such that said pumps are arranged in series, with an outlet from said high pressure getter pump connecting via an aperture within the flange to an inlet of said at least one high vacuum pump.

* * * * *